(12) United States Patent
Liu et al.

(10) Patent No.: US 11,011,472 B2
(45) Date of Patent: May 18, 2021

(54) SELF-ALIGNED REGISTER STRUCTURE FOR BASE POLYSILICON AND PREPARATION METHOD THEREOF

(71) Applicant: CHINA ELECTRONICS TECHNOLOGY GROUP CORPORATION NO. 55 RESEARCH INSTITUTE, Jiangsu (CN)

(72) Inventors: Hongjun Liu, Jiangsu (CN); Xianwei Ying, Jiangsu (CN); Yangyang Zhao, Jiangsu (CN); Guoxing Sheng, Jiangsu (CN)

(73) Assignee: CHINA ELECTRONICS TECHNOLOGY GROUP CORPORATION NO. 55 RESEARCH INSTITUTE, Jiangsu (CN)

( * ) Notice: Subject to any disclaimer, the term of this patent is extended or adjusted under 35 U.S.C. 154(b) by 0 days.

(21) Appl. No.: 16/462,942

(22) PCT Filed: Dec. 29, 2017

(86) PCT No.: PCT/CN2017/119752
§ 371 (c)(1),
(2) Date: May 22, 2019

(87) PCT Pub. No.: WO2018/095440
PCT Pub. Date: May 31, 2018

(65) Prior Publication Data
US 2020/0066649 A1 Feb. 27, 2020

(51) Int. Cl.
*H01L 23/544* (2006.01)
*H01L 21/02* (2006.01)
(Continued)

(52) U.S. Cl.
CPC ........ *H01L 23/544* (2013.01); *H01L 21/0271* (2013.01); *H01L 21/02236* (2013.01);
(Continued)

(58) Field of Classification Search
None
See application file for complete search history.

(56) References Cited

U.S. PATENT DOCUMENTS

2013/0207235 A1  8/2013  Faucher et al.
2020/0066649 A1* 2/2020  Liu ....................... H01L 21/308

FOREIGN PATENT DOCUMENTS

CN    101599435    12/2009
CN    103915334     7/2014
(Continued)

OTHER PUBLICATIONS

"International Search Report (Form PCT/ISA/210)", dated Mar. 28, 2018, with English translation thereof, pp. 1-4.

*Primary Examiner* — Long Pham
(74) *Attorney, Agent, or Firm* — JCIPRNET

(57) ABSTRACT

The present invention discloses a self-aligned register structure for base polysilicon and a preparation method thereof. The self-aligned register structure comprises a silicon substrate having a partially oxidized region of SiO2 medium, a SiO2 medium protective layer is arranged at a center above the silicon substrate, base polysilicon layers are located at left and right sides of the SiO2 medium protective layer, the adjacent base polysilicon layers are symmetrical to the SiO2 medium protective layer at equal spacing, and the spacing is equal to a thickness of the base polysilicon layer. The self-aligned register structure for base polysilicon of the present invention meets an extremely high register requirement, guarantees the uniformity of electric parameters of devices, and eliminates physical or chemical damage to an intrinsic region when etching a surface of the silicon sub-
(Continued)

strate during the forming of the base polysilicon, thus reducing the capacitance and enhancing the product yield; and meanwhile, the preparation method is simple, convenient, low in cost, and short in time.

10 Claims, 3 Drawing Sheets

(51) Int. Cl.
  *H01L 21/027* (2006.01)
  *H01L 21/308* (2006.01)
  *H01L 29/73* (2006.01)
(52) U.S. Cl.
  CPC ...... *H01L 21/02595* (2013.01); *H01L 21/308* (2013.01); *H01L 29/73* (2013.01); *H01L 2223/54426* (2013.01)

(56) References Cited

FOREIGN PATENT DOCUMENTS

| | | |
|---|---|---|
| CN | 106601660 | 4/2017 |
| JP | 2001338929 | 12/2001 |

* cited by examiner

SELF-ALIGNED REGISTER STRUCTURE FOR BASE POLYSILICON AND PREPARATION METHOD THEREOF

CROSS-REFERENCE TO RELATED APPLICATION

This application is a 371 application of the international PCT application serial no. PCT/CN2017/119752, filed on Dec. 29, 2017, which claims the priority benefit of China application no. 201611041436.0, filed on Nov. 22 2016. The entirety of each of the above-mentioned patent applications is hereby incorporated by reference herein and made a part of this specification.

BACKGROUND

Technical Field

The present invention relates to the design and manufacturing of semiconductor microelectronics, and more particularly, to a self-aligned register structure for base polysilicon and a preparation method thereof.

Description of Related Art

In the field of microwave technologies, bipolar transistors are mainly used in such fields like high-speed drive circuits, high-frequency signal receiving and amplification. Especially in the field of low noise amplifiers, Si-based bipolar transistor devices still have an irreplaceable advantage over GaAs and GaN-based materials due to low phase noise at low frequencies. A noise performance of a silicon bipolar transistor is closely related to a frequency performance thereof. The higher the frequency performance is, the better the noise performance is. Therefore, the main purpose to design the silicon bipolar transistor is to increase a cutoff frequency of the device, wherein the measures are as follows: 1) thin-base technology, 2) in-situ doped polysilicon emitter technology, and 3) double-polysilicon self-alignment technology, etc. The double-polysilicon self-alignment technology means that both a polysilicon technology is employed in both a base and an emitter of the bipolar transistor, which is characterized by using a side wall base polysilicon self-alignment technology to form the emitter polysilicon and control an effective width of the emitter, thus being capable of significantly reducing parasitic parameters between intrinsic knots of the devices. This technology increases a cutoff frequency of a silicon-based bipolar transistor from a conventional frequency of 10 GHz to more than 20 GHz.

In the double-polysilicon self-alignment technology, there is a technical difficulty, i.e., the intrinsic region protection control between the base polysilicon and the silicon substrate, and the intrinsic region used for the emitter polysilicon of a subsequent process. If a $SiO_2$ protective layer is not used, it is difficult for the process to ensure that the intrinsic region of the device is not damaged when the base polysilicon etching is terminated on a silicon-silicon substrate. If the $SiO_2$ protective layer is used, there is a problem of register between the base polysilicon formed before and after the two photoetching and the $SiO_2$ medium. Generally, the spacing between the base polysilicon is about 1 μm. When the size of the $SiO_2$ protective layer is greater than 1 μm, the base polysilicon overlaps in the $SiO_2$ protective layer, so the register conditions of the two cannot be measured and judged by process. However, when the size of the $SiO_2$ protective layer is controlled at 0.6-0.7 μm, the distance between the $SiO_2$ and the base polysilicon is only 0.15-0.2 μm. Therefore, the register requirement is very high, and poor register will make the $SiO_2$ be not able to protect the intrinsic region or overlap with the base polysilicon. These register offset factors will directly affect the electric parameter consistency of the devices.

SUMMARY

Object of the present invention: in view of the problems existing in the prior art, the present invention provides a self-aligned register structure for base polysilicon, which achieves an extremely high register requirement, and ensures electric parameter consistency of devices. The present invention further provides preparation method of a self-aligned register structure for base polysilicon.

Technical solutions: in order to achieve the object above, the self-aligned register structure for base polysilicon according to the present invention comprises a silicon substrate having a partially oxidized region of $SiO_2$ medium, a $SiO_2$ medium protective layer is arranged at a center above silicon substrate, base polysilicon layers are located at left and right sides of the $SiO_2$ medium protective layer, the adjacent base polysilicon layers at both sides are symmetrical to the $SiO_2$ medium protective layer at equal spacing, and the spacing is equal to a thickness of the base polysilicon layer.

Preferably, the silicon substrate between the $SiO_2$ medium protective layer and the adjacent base polysilicon layers is slightly etched to a depth of 0.1-0.2 μm. That is, the silicon substrate at the spacing between the $SiO_2$ medium protective layer and the adjacent base polysilicon layers at both sides is lightly etched to a depth of 0.1-0.2 μm, which can effectively control a diffusion length of the base with a high concentration to the intrinsic region.

The preparation method of a self-aligned register structure for base polysilicon according to the present invention comprises the following steps of:

(1) oxidizing to form a $SiO_2$ medium protective layer on a silicon substrate having a partially oxidized region of $SiO_2$ medium, and depositing a polysilicon layer on the $SiO_2$ medium protective layer;

(2) photoetching the polysilicon layer and terminating the photoetching at the $SiO_2$ medium protective layer, and removing the $SiO_2$ medium protective layer without the polysilicon layer thereon by wet etching;

(3) depositing a base polysilicon layer on the basis of the step (2);

(4) spinningly coating a photoresist on the base polysilicon layer, and then etching back the photoresist and the base polysilicon layer without the protection of the photoresist to expose the polysilicon layer on the $SiO_2$ medium protective layer;

(5) keeping on etching back the polysilicon layer and terminating the etching back at the $SiO_2$ medium protective layer, a termination position of the $SiO_2$ medium protective layer being just at the center of the base polysilicon; and (6) removing the photoresist to obtain the self-aligned register structure for base polysilicon.

Preferably, a thickness of the $SiO_2$ medium protective layer formed by oxidizing in the step (1) is 300 Å to 400 Å.

Preferably, a thickness of the polysilicon layer in the step (1) is 4000 Å to 5000 Å.

Preferably, a thickness of the $SiO_2$ medium protective layer removed by wet etching in the step (2) is 300 Å to 400 Å.

Preferably, a thickness of the base polysilicon layer in the step (3) is 2000 Å to 3000 Å.

Preferably, a photoresist with a thickness of 0.8-1.2 μm is spinningly coated on the base polysilicon layer, and then, the photoresist is etched back to 0.4-0.6 μm.

After the terminating terminated at the $SiO_2$ medium protective layer in the step (5), the silicon substrate between the $SiO_2$ medium protective layer and the base polysilicon layers at both sides is lightly etched to a depth of 0.1-0.2 μm, and to a width equal to a thickness of the finally remained base polysilicon layer. The method of lightly etching the silicon substrate between the $SiO_2$ medium protective layer and the adjacent base polysilicon at both sides can effectively control the diffusion length of the high concentration base to the intrinsic region, and the thin layer $SiO_2$ can be used as a reference for light over-etching degree to reduce the capacitance and improve the yield.

Beneficial effects: compared with the prior art, the present invention has the following advantages.

1. The self-aligned register structure for base polysilicon of the present invention meets an extremely high register requirement between the base polysilicon and the $SiO_2$ medium protective layer, can select an etching termination layer by using the $SiO_2$ medium protective layer, and eliminate the physical or chemical damages to the intrinsic region when etching to a surface of the silicon substrate during the forming of the base polysilicon.

2. The termination position of the $SiO_2$ medium protective layer is just at the center of the base polysilicon, achieving an extremely high register requirement and ensuring the electric parameter consistency of the devices.

3. The method of lightly etching the silicon substrate between the $SiO_2$ medium protective layer and the adjacent base polysilicon can effectively control the diffusion length of the high concentration base to the intrinsic region, and the thin layer $SiO_2$ can be used as a reference for light over-etching degree to reduce the capacitance and improve the yield.

4. The preparation method of the present invention is simple, convenient, low in cost, and short in time.

DESCRIPTION OF THE EMBODIMENTS

The present invention is further explained with reference to the embodiment and drawings hereinafter.

EMBODIMENT

Figure 1:
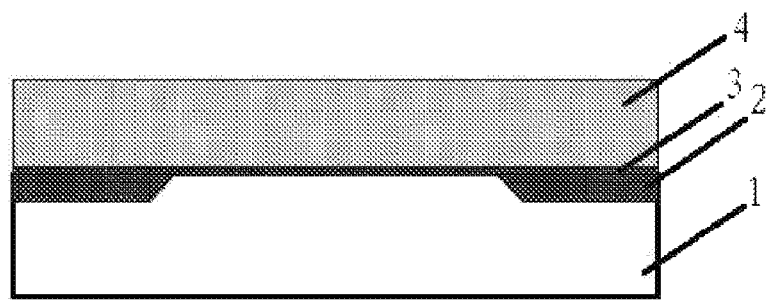
FIG. 1 is a schematic diagram of oxidizing to form a $SiO_2$ medium protective layer on a silicon substrate having a partially oxidized region of $SiO_2$ medium, and depositing a polysilicon layer.
Figure 2:
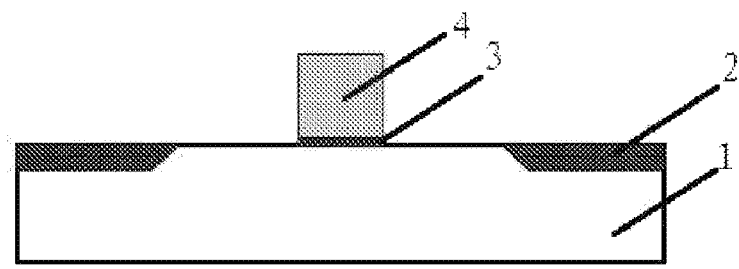
FIG. 2 is a schematic diagram of removing the $SiO_2$ medium protective layer after photoetching and etching the polysilicon layer.
Figure 3:
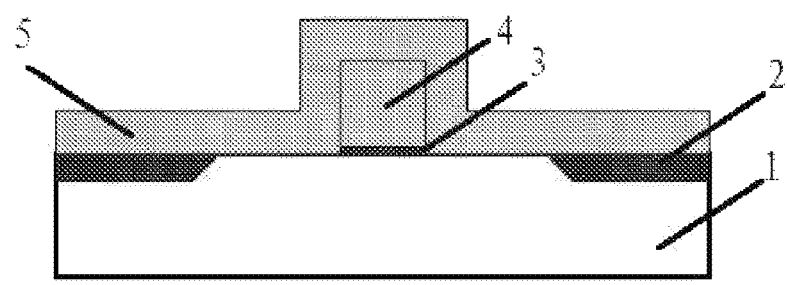
FIG. 3 is a schematic diagram of depositing a base polysilicon layer.
Figure 4:
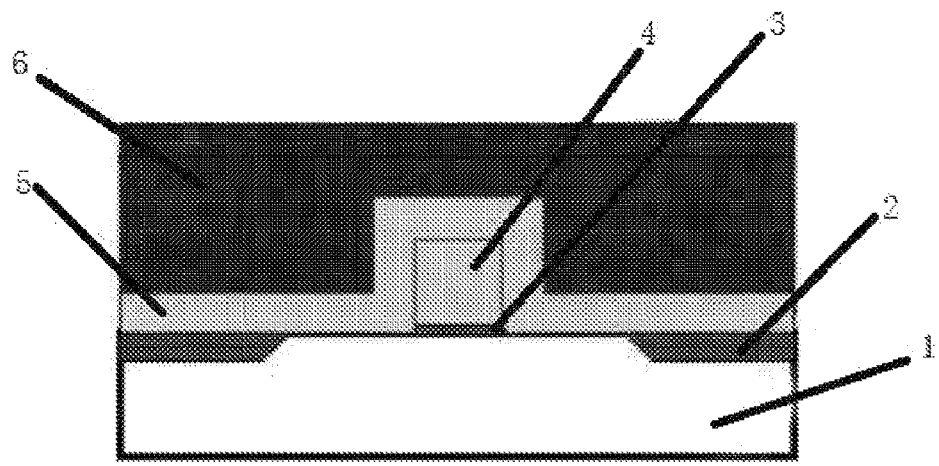
FIG. 4 is a schematic diagram of spinningly coating a photoresist.
Figure 5:
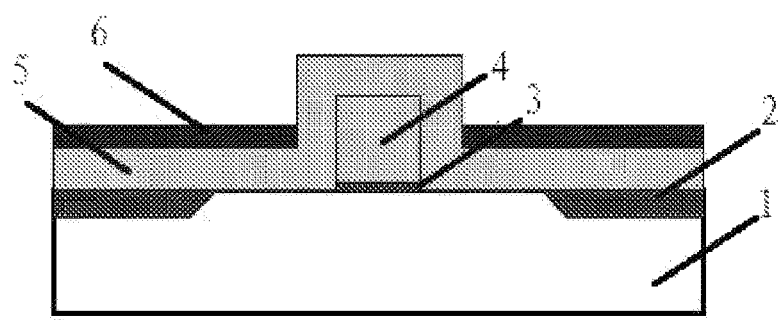
FIG. 5 is a schematic diagram of etching back the photoresist.
Figure 6:
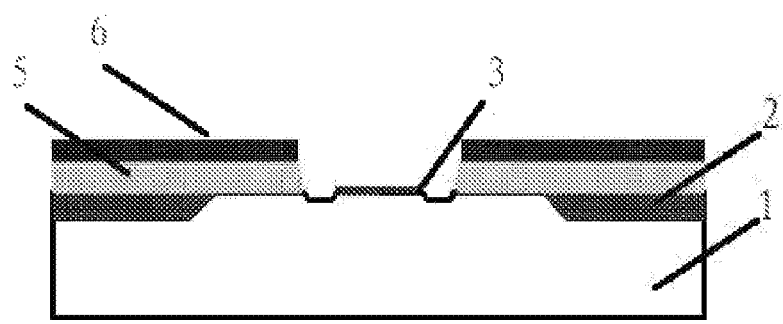
FIG. 6 is a schematic diagram of etching the polysilicon layer and terminating at the $SiO_2$ medium protective layer.
Figure 7:
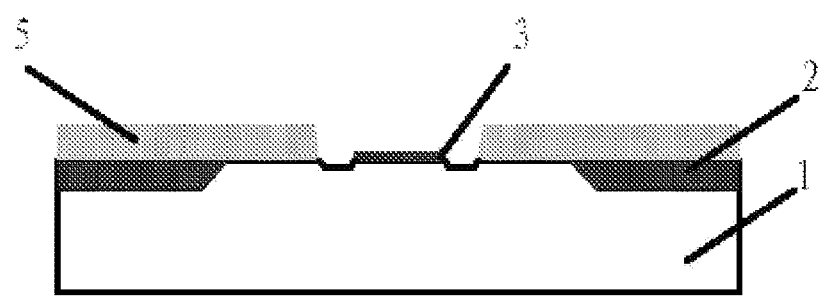
FIG. 7 is a schematic diagram of removing the photoresist, forming the base polysilicon and the $SiO_2$ medium protective layer, and obtaining a base polysilicon self-aligned register structure.

As shown in FIG. 1, before forming a base polysilicon, oxidizing is performed to form a $SiO_2$ medium protective layer with a thickness of 300 Å to 400 Å on a silicon substrate 1 having a partially oxidized region of $SiO_2$ medium 2, and a polysilicon layer 4 with a thickness of 4000 Å to 5000 Å is deposited on the $SiO_2$ medium protective layer 3 to achieve damage-free protection of an intrinsic region of a device. As shown in FIG. 2, the polysilicon layer 4 is photoetched and the photoetching is terminated at the $SiO_2$ medium protective layer 3, then the $SiO_2$ medium protective layer 3 without the polysilicon layer thereon is removed by wet etching. As shown in FIG. 3, the deposited base polysilicon layer 5 is grown to a thickness of 2000 Å to 3000 Å, and a boron-doped base polysilicon layer is preferred. As shown in FIG. 4, a photoresist 6 with a thickness of 0.8-1.2 μm is spinningly coated on the base polysilicon layer 5. Preferably, the thickness of the spinningly coated is 1 μm. As shown in FIG. 5, the photoresist 6 is etched back to 0.4-0.6 μm, preferably the photoresist is etched back to 0.6 μm, so that the polysilicon layer 4 on the $SiO_2$ medium protective layer 3 is exposed. As shown in FIG. 6, the remained polysilicon layer 4 is etched, and the etching is terminated at the $SiO_2$ medium protective layer 3. The silicon substrate 1 between the $SiO_2$ medium protective layer 3 and the base polysilicon layers 5 is lightly etched to a depth of 0.1-0.2 μm, and a width of the lightly etched silicon substrate is equal to a thickness of the finally remained base polysilicon layer. As shown in FIG. 7, the remained photoresist is removed to obtain a self-aligned register structure for base polysilicon.

The self-aligned register structure prepared comprises a silicon substrate 1 having a partially oxidized area of $SiO_2$ medium 2, a $SiO_2$ medium protective layer 3 is arranged at a center above the silicon substrate 1, base polysilicon layers 5 are located at left and right sides of the $SiO_2$ medium protective layer 3, the adjacent base polysilicon layers 5 at both sides are symmetrical to the $SiO_2$ medium protective layer 3 at equal spacing, and the spacing is equal to a thickness of the base polysilicon layer 5. A termination position of the $SiO_2$ medium protective layer 3 is just at the center of the base polysilicon layer 5. The silicon substrate between the $SiO_2$ medium protective layer 3 and the adjacent base polysilicon layers 5 at both sides is lightly etched to a depth of 0.1-0.2 μm, and a width of the lightly etched silicon substrate is equal to a thickness of the finally remained base polysilicon layer. The self-aligned register structure for base polysilicon realizes self-aligned register of the base polysilicon and the $SiO_2$ medium protective layer in the technological process of the double-polysilicon self-aligned bipolar transistors.

What is claimed is:

1. A self-aligned register structure for base polysilicon, comprising a silicon substrate having a partially oxidized region of $SiO_2$ medium, wherein a $SiO_2$ medium protective layer is arranged at a center above the silicon substrate, base polysilicon layers are located at left and right sides of the $SiO_2$ medium protective layer, the adjacent base polysilicon layers at both sides are symmetrical to the $SiO_2$ medium protective layer at equal spacing, and the spacing is equal to a thickness of each of the base polysilicon layers.

2. The self-aligned register structure for base polysilicon according to claim 1, wherein the silicon substrate between the $SiO_2$ medium protective layer and the adjacent base polysilicon layers at both sides is slightly etched to a depth of 0.1-0.2 μm.

3. A preparation method of a self-aligned register structure for base polysilicon, the preparation method comprising the following steps of:
   (1) oxidizing to form a $SiO_2$ medium protective layer on a silicon substrate having a partially oxidized region of $SiO_2$ medium, and depositing a polysilicon layer on the $SiO_2$ medium protective layer;
   (2) photoetching the polysilicon layer and terminating the photoetching at the $SiO_2$ medium protective layer, and removing the $SiO_2$ medium protective layer without the polysilicon layer thereon by wet etching;
   (3) depositing a base polysilicon layer on the silicon substrate and the polysilicon layer after the step (2);
   (4) spinningly coating a photoresist on the base polysilicon layer, and then etching back the photoresist and the base polysilicon layer without the protection of the photoresist etched back to expose the polysilicon layer on the $SiO_2$ medium protective layer;
   (5) keeping on etching back the polysilicon layer and terminating the etching back at the $SiO_2$ medium protective layer; and
   (6) removing the photoresist to obtain the self-aligned register structure for base polysilicon, wherein the obtained self-aligned register structure for base polysilicon has the $SiO_2$ medium protective layer arranged at a center above the silicon substrate, base polysilicon layers located at left and right sides of the $SiO_2$ medium protective layer, the adjacent base polysilicon layers at both sides are symmetrical to the SiO2 medium protective layer at equal spacing, and the spacing is equal to a thickness of each of the base polysilicon layers.

4. The preparation method according to claim 3, wherein a thickness of the $SiO_2$ medium protective layer formed by oxidizing in the step (1) is 300 Å to 400 Å.

5. The preparation method according to claim 3, wherein a thickness of the polysilicon layer in the step (1) is 4000 Å to 5000 Å.

6. The preparation method according to claim 3, wherein a thickness of the $SiO_2$ medium protective layer removed by wet etching in the step (2) is 300 Å to 400 Å.

7. The preparation method according to claim 3, wherein a thickness of the base polysilicon layer in the step (3) is 2000 Å to 3000 Å.

8. The preparation method according to claim 3, wherein in the step (4), the photoresist with a thickness of 0.8-1.2 μm is spinningly coated on the base polysilicon layer, and then the photoresist with a thickness of 0.4-0.6 μm is etched back.

9. The preparation method according to claim 3, wherein after terminating at the $SiO_2$ medium protective layer in the step (5), the silicon substrate between the $SiO_2$ medium protective layer and the base polysilicon layer is lightly etched.

10. The preparation method according to claim 9, wherein the silicon substrate is slightly etched to a depth of 0.1-0.2 μm in the step (5), and to a width equal to a thickness of the finally remained base polysilicon layer.

* * * * *

UNITED STATES PATENT AND TRADEMARK OFFICE
CERTIFICATE OF CORRECTION

PATENT NO. : 11,011,472 B2
APPLICATION NO. : 16/462942
DATED : May 18, 2021
INVENTOR(S) : Hongjun Liu et al.

Page 1 of 1

It is certified that error appears in the above-identified patent and that said Letters Patent is hereby corrected as shown below:

On the Title Page

Item (30), add:
(30) Foreign Application Priority Data
Nov. 22, 2016 (CN) …………..201611041436.0

Signed and Sealed this
Tenth Day of August, 2021

Drew Hirshfeld
*Performing the Functions and Duties of the*
*Under Secretary of Commerce for Intellectual Property and*
*Director of the United States Patent and Trademark Office*